United States Patent
Wohlrab et al.

[11] Patent Number: 6,118,700
[45] Date of Patent: Sep. 12, 2000

[54] ELECTRICALLY PROGRAMMABLE READ-ONLY MEMORY AND METHOD FOR PROGRAMMING AND READING THE MEMORY

[75] Inventors: Erdmute Wohlrab; Werner Weber, both of Munich, Germany

[73] Assignee: Siemens Aktiengesellschaft, Munich, Germany

[21] Appl. No.: 09/236,517

[22] Filed: Jan. 25, 1999

[30] Foreign Application Priority Data

Feb. 12, 1998 [DE] Germany .......................... 198 05 782

[51] Int. Cl.⁷ .................................................. G11C 11/34
[52] U.S. Cl. .................................. 365/185.19; 365/185.05
[58] Field of Search .................... 365/185.19, 185.05, 365/185.21, 185.22, 185.25, 185.24

[56] References Cited

U.S. PATENT DOCUMENTS 5,671,186  9/1997  Igura ........................................ 365/203
5,818,761  10/1998  Onakado et al. .

FOREIGN PATENT DOCUMENTS

WO 94/27295  11/1994  WIPO .

OTHER PUBLICATIONS

New Operation Mode for Stacked–Gate Flash Memory Cell—IEEE Electron Device Letters, vol. 16, No. 3, Mar. 1995.

Novel Self–limiting Program Scheme Utilizing N–channel Select Transistors in P–channel DINOR Flash Memory—Ohnakado et al—1996 IEEE.

An Experimental Confirmation of Automatic Threshold Voltage Convergence in a Flash Memory Using Alternating Word–Line Voltage Pulses—IEEE Electron Device Letters, vol. 18, No. 10 Oct. 1997—Gotou.

*Primary Examiner*—A. Zarabian
*Attorney, Agent, or Firm*—Hill & Simpson

[57] ABSTRACT

In an electrically programmable read-only memory and method for the programming and reading of the memory, a self-convergent programming of a flash EEPROM is provided in which it is possible to rapidly and reliably set an inception voltage of a memory cell.

5 Claims, 1 Drawing Sheet

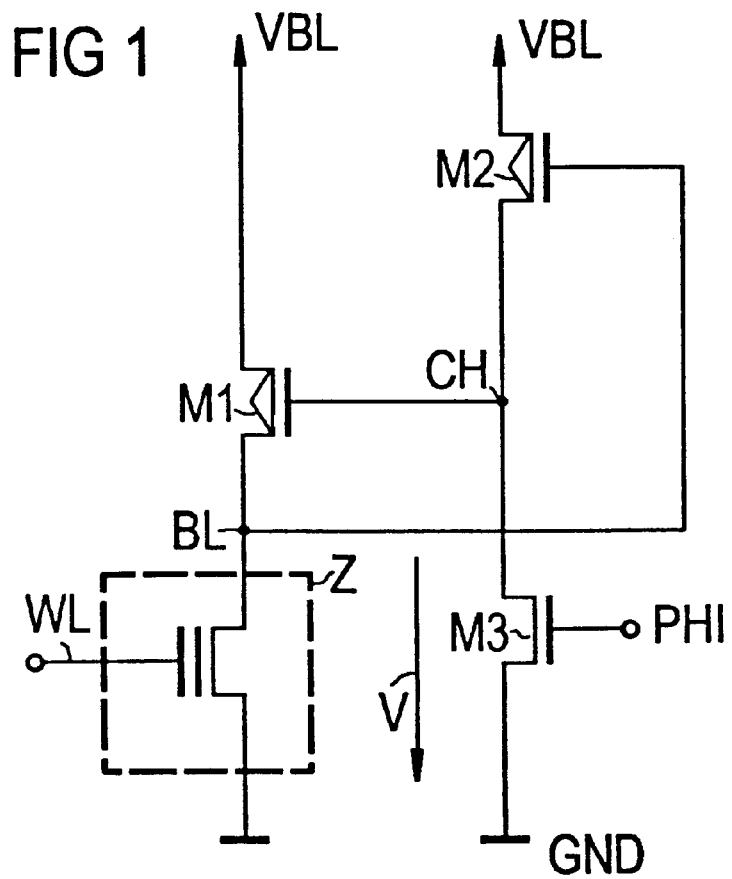
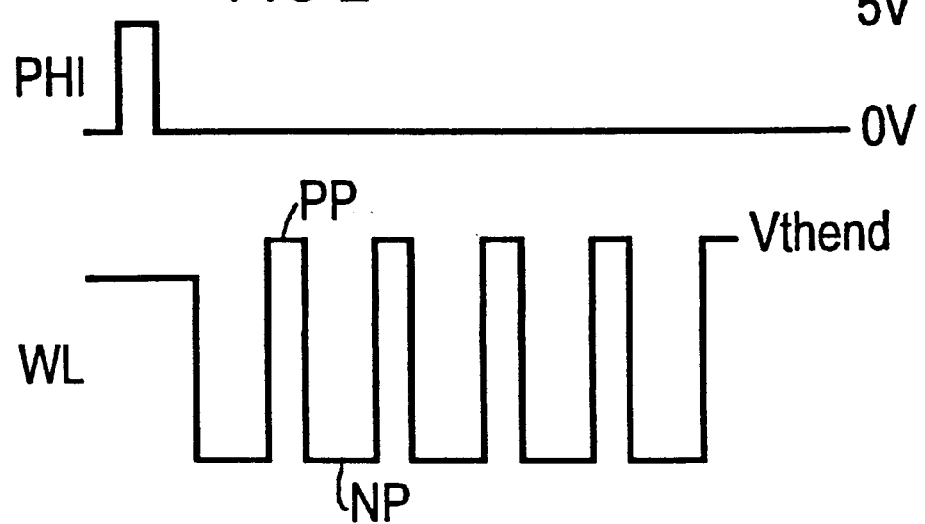

ELECTRICALLY PROGRAMMABLE READ-ONLY MEMORY AND METHOD FOR PROGRAMMING AND READING THE MEMORY

BACKGROUND OF THE INVENTION

The invention relates to electrically programmable read-only memory cells, what are known as flash EEPROM cells, which are not only erased but also programmed by Fowler Nordheim tunnels. For reasons of selectability, in these EEPROM cells the inception voltage is high, e.g. 5V, in the erased case, and low, e.g. 1V, in the programmed case. A high threshold voltage means that there is a high negative charge on the floating gate of the respective cell transistor. Conversely, given a low threshold voltage, the floating gate is not charged, or barely so. The control gate of a respective cell transistor is connected to a word line, and the drain terminal of a respective cell transistor is connected to a bit line. A programming occurs by the application of −10V at the word line and 5V at the bit line, for example. Sometimes, individual cells can be programmed particularly easily, which can lead to what is known as "overprogramming", whereby these cells comprise a negative threshold voltage consequent to a positive charge on the floating gate. In the readout of cells, the selected word line lies at 2.5V, the corresponding bit line lies at 1V, and the non-selected word and bit lines remain at 0V, for example. If the threshold voltage of the selected cell is low, then a bit line current flows under these voltage conditions, and the cell is recognized as programmed. If the cell has been erased, then a bit line current usually does not flow; however, if the threshold voltage is negative due to overprogramming, then a current does flow through these cells, even though they were not selected. If, for example, a cell is read out which is actually an erased cell, a false evaluation can result. For this reason, negative values of the threshold voltage must generally be avoided. In addition, for smaller operating voltages or multi-level applications, the distribution of the inception voltages of a cell field should be optimally low, and the value of the threshold voltage should be adjustable.

In IEEE Electronic Device Letters; Vol. 16, No. 3, March 1995: 121–123, a mechanism is taught in which the bit line can either be charged with 5V via a charge transistor or can be discharged to 0V via a discharge transistor. The problem of what is known as overprogramming is prevented by what is known as a self-converging programming. The latter occurs in that, during a negative phase of a pulse at the word line, the negative charge on the floating gate drops, and with it the inception voltage of the cell, and in a positive phase of the pulse of the word line, it is checked whether or not the desired threshold voltage has been attained yet. If the desired threshold voltage has been attained, the cell opens, and the bit line thereby discharges, whereby subsequent negative pulses do not effect further programming. However, measurements have demonstrated that the bit line is prematurely discharged due to leakage currents into the substrate, and thus an incomplete programming often occurs.

The IEEE Paper to the IEDM 96, 7.4.1 to 7.4.4, pages 181 to 184 teaches that the bit line is recharged by a weakly opened transistor, it being possible to avoid an overly low programming in this way. However, it is disadvantageous that this functions only given a very specific bit line voltage at the recharge transistor, and for even slight deviations of 0.1V, for example, either an overly low programming or a non-convergence at the desired threshold voltage value occurs. Another disadvantage is that the programming phase may not be longer than approximately 1 $\mu s$, since otherwise the bit line is charged again via the recharge transistor during the programming of the bit line, and the cell is thus further programmed. Due to an overly low programming pulse width, many program/read cycles are necessary, which prolongs the total programming time unnecessarily.

SUMMARY OF THE INVENTION

An object on which the invention is based is to provide a read-only memory with a mechanism for evaluating and controlling the bit line voltage, as well as methods for its programming and for the reading of this memory, in which the abovementioned disadvantages are avoided, and the desired threshold voltage of the memory cell is to a large extent freely selectable and can be set relatively precisely.

According to the present invention, an electrically programmable read-only memory is provided having at least one memory cell comprising a transistor with a floating gate, a control gate connected to a word line, a drain terminal connected to a bit line, and a source terminal connected to reference potential. The bit line is connected to a bit line supply voltage via a first p-channel MOS transistor. A gate of the first transistor is connected to the bit line supply voltage via a second p-channel MOS transistor and to reference potential via an n-channel MOS transistor. The bit line is connected to a gate of the second p-channel MOS transistor, and a gate of the n-channel MOS transistor is connected to an input for a pulse-shaped voltage.

In a method for programming the read-only memory, with the aid of the n-channel MOS transistor and of the first p-channel MOS transistor, and by means of the pulse-shaped voltage, the bit line is connected to the bit line supply voltage. A pulse sequence with negative and positive pulses is subsequently applied to the word line such that during the negative pulse, the at least one memory cell is programmed, and during the positive pulse, it is checked whether a desired threshold voltage of the transistor of the at least one memory cell has been obtained yet. Subsequent to the attainment of the desired threshold voltage, the at least one memory cell becomes conductive, and the voltage at the bit line consequently becomes lower, causing an opening of the second p-channel MOS transistor and a closing of the p-channel MOS transistor, whereby the bit line is decoupled from the bit line supply voltage and the now conductive at least one memory cell is discharged to reference potential.

The invention comprises additional advantages in that, among other things, the mechanism functions largely independently of supply voltage fluctuations, only the previously common program/read voltage levels are required, and relatively high leakage currents of the bit line are tolerated.

A preferred exemplifying embodiment of the invention is detailed below with the aid of the drawings.

BRIEF DESCRIPTION OF THE DRAWINGS

FIG. 1 is a block diagram of the exemplifying embodiment of the invention; and

FIG. 2 shows corresponding pulse diagrams for the explication of the functioning of the mechanism depicted in FIG. 1.

DESCRIPTION OF THE PREFERRED EMBODIMENTS

FIG. 1 depicts a cell Z, which represents a plurality of flash EEPROM memory cells, said cell Z being formed of a transistor with a floating gate, whose control gate is connected to the word line WL, ;vhose drain terminal is connected to the bit line BL, and whose source terminal is connected to reference potential GND. The actual mechanism for the evaluation and control of the bit line voltage on the bit line BL comprises two p-channel MOS transistors M1 and M2 and an n-channel MOS transistor M3, it being possible to connect the bit line BL to a bit line supply voltage VBL via the transistor M1. The gate of the transistor M2 is connected to the bit line BL, and a pulse-shaped voltage PHI is applied to the gate of the transistor M3. The two transistors M2 and M3 are serially connected, whereby a first terminal of the transistor M2 is connected to the bit line supply voltage VBL, a first terminal of the transistor M3 is connected to reference potential GND, and a connecting node CH of the two transistors is connected to the gate of the transistor M1.

As depicted in FIG. 2, at the beginning of the programming, the positive pulse PHI at the gate of the transistor M3 effects an opening of the transistor M3, whereby the node CH, or respectively the gate of the transistor M1, receives ground potential, the transistor M1 opening, in turn, and the bit line supply voltage VBL thus lying at the bit line BL as voltage V. A programming can now be programmed by the application of negative pulses at the word line, as in the cited known mechanisms. As already described in the Prior Art, in the positive phase of the pulse, it is assessed whether or not the cell has already been sufficiently programmed. If the desired threshold voltage Vthend has already been attained, then the cell becomes conductive and the voltage at the bit line becomes lower, and the transistor M2 thereby opens, effecting a closing of the transistor M1. This leads to a decoupling from the bit line supply voltage VBL and to a discharging of the bit line BL to reference potential via the now conductive cell. Programming is thus terminated for the cell Z. As in the cited Prior Art, the mechanism should be executed once per bit line of a cell field, so that all the cells connected to a word line can be programmed simultaneously.

Multi-valued memories can also be programmed reliably and simply, it being possible to program different threshold voltages, and thus more than two logical states, by modifying the amplitude of the programming pulses.

The mechanism can also be operated as a sense amplifier, whereby, instead of a programming pulse, a read voltage whose value is selected higher than the desired threshold voltage Vthend is applied at the word line WL. The n-channel MOS transistor (M3) is then wired such that it precharges the bit line, via the p-channel MOS transistor (M1), to a bit line read voltage VBL' which is usually lower than the bit line supply voltage VBL. In the readout, a logical zero or a logical one on the bit line BL indicates whether the cell is erased or programmed.

Accordingly, a sense amplifier for a multi-valued memory is also conceivable if the cell is read out with different voltages at the word line.

Although various minor modifications might be suggested by those skilled in the art, it should be understood that our wish to embody within the scope of the patent warranted hereon all such modifications as reasonably and properly come with the scope of our contribution to the art.

We claim as our invention:

1. An electrically programmable read-only memory, comprising:
    at least one memory cell comprising a transistor with a floating gate, a control gate connected to the word line, a drain terminal connected to a bit line, and a source terminal connected to a reference potential;
    the bit line being connected to a bit line supply voltage via a first p-channel MOS transistor, and a gate of the first transistor connected to said bit line supply voltage via a second p-channel MOS transistor and to the reference potential via an n-channel MOS transistor; and
    the bit line being connected to a gate of the second p-channel MOS transistor, and a gate of the n-channel MOS transistor being connected to an input for a pulse-shaped voltage.

2. A method for programming a read-only memory where at least one memory cell is provided having a transistor with a floating gate, a control gate connected to a word line, a drain terminal connected to a bit line, and a source terminal connected to a reference potential, wherein the bit line is connected to a bit line supply voltage via a first p-channel MOS transistor, a gate of the first transistor being connected to the bit line supply voltage via a second p-channel MOS transistor and to the reference potential via an n-channel MOS transistor, and wherein the bit line is connected to a gate of the second p-channel MOS transistor, and a gate of the n-channel MOS transistor is connected to an input for a pulse-shaped voltage, comprising the steps of:
    with aid of the n-channel MOS transistor and of the first p-channel MOS transistor, by means of the pulse-shaped voltage connecting the bit line to the bit line supply voltage;
    subsequently applying a pulse sequence with negative and positive pulses at the word line so that during the negative pulse, the at least one memory cell is programmed, and during the positive pulse, it is checked whether a desired threshold voltage of the transistor of the at least one memory cell has been obtained yet; and
    subsequent to the attainment of the desired threshold voltage and with the at least one memory becoming conductive and the voltage of the bit line consequently becoming lower, opening the second p-channel MOS transistor and closing the p-channel MOS transistor so that the bit line is decoupled from the bit line supply voltage and the now conductive at least one memory cell is discharged to the reference potential.

3. The method according to claim 2 including a step of generating various desired threshold voltages, a respective desired threshold voltage being set by a corresponding amplitude of the positive pulse.

4. A method for reading a read-only memory having at least one memory cell comprising a transistor with a floating gate, a control gate connected to a word line, a drain terminal connected to a bit line, and a source terminal connected to a reference potential, and wherein the bit line is connected to a bit line supply voltage via a first p-channel MOS transistor, a gate of the first transistor being connected to said bit line supply voltage via a second p-channel MOS transistor into the reference potential via an n-channel MOS transistor, and wherein the bit line is connected to a gate of the second p-channel MOS transistor, and a gate of the n-channel MOS transistor being connected to an input for pulse-shaped voltage, comprising the steps of:
    connecting the n-channel MOS transistor such that it pre-charges the bit line to a bit line read voltage via the p-channel MOS transistor;
    subsequently applying a read voltage at the word line of a respective memory cell, said voltage being more positive then a programmed threshold voltage of the transistor of said memory cell; and
    subsequently rendering a logical state of said memory cell by the voltage of the bit line.

5. The method according to claim 4 including the step of reading out memory cells with different read voltages at the word lines of the memory cells being read.

* * * * *